(12) United States Patent
Lundén

(10) Patent No.: US 6,324,074 B1
(45) Date of Patent: *Nov. 27, 2001

(54) ELECTRONIC DEVICE HAVING A SHIELD MEMBER AND A SHIELD GASKET

(75) Inventor: Olli-Pekka Lundén, Suinula (FI)

(73) Assignee: Nokia Mobile Phones Ltd., Espoo (FI)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/116,788

(22) Filed: Jul. 16, 1998

(30) Foreign Application Priority Data

Jul. 18, 1997 (GB) .................................. 9715137

(51) Int. Cl.⁷ ..................................................... H05K 9/00
(52) U.S. Cl. .................... 361/816; 361/737; 361/753; 361/800; 174/35 R; 206/79
(58) Field of Search ..................... 361/737, 800, 361/796, 816, 817, 814, 752, 753; 174/35 R, 35 GC, 51; 206/719

(56) References Cited

U.S. PATENT DOCUMENTS

| 4,831,498 | * | 5/1989 | Baba ........................... 174/35 GC |
| 4,890,199 | * | 12/1989 | Beutler .............................. 361/818 |
| 4,912,604 | | 3/1990 | Vaisanen ............................ 361/424 |
| 4,945,633 | | 8/1990 | Hakanen et al. ..................... 29/825 |
| 5,006,667 | | 4/1991 | Lonka ............................. 174/35 R |
| 5,271,056 | | 12/1993 | Pesola et al. ....................... 379/58 |
| 5,323,299 | * | 6/1994 | Weber ............................... 361/818 |
| 5,354,951 | * | 10/1994 | Lange, Sr. et al. ............... 174/35 R |
| 5,365,410 | | 11/1994 | Lonka ............................. 361/816 |
| 5,392,461 | * | 2/1995 | Yokoyama ........................... 455/89 |
| 5,400,949 | | 3/1995 | Hirvonen et al. ............. 228/180.22 |
| 5,442,521 | | 8/1995 | Hirvonen et al. .................. 361/800 |
| 5,495,399 | * | 2/1996 | Gore et al. ....................... 361/814 |
| 5,603,103 | | 2/1997 | Halttunnen et al. ................ 455/90 |
| 5,687,470 | | 11/1997 | Halttunen et al. ............... 29/592.1 |
| 5,742,004 | * | 4/1998 | Greco et al. ..................... 174/35 R |
| 5,742,488 | | 4/1998 | Lonka et al. ..................... 361/816 |

FOREIGN PATENT DOCUMENTS 0 756 446 A1   1/1997   (EP) .

* cited by examiner

Primary Examiner—Jayprakash N. Gandhi
(74) Attorney, Agent, or Firm—Perman & Green, LLP

(57) ABSTRACT

A portable device comprising a housing (105, 110); a circuit board (125) located within the housing; and a tubular shield member (130) mounted at a first end (132) on the circuit board (125) so as to surround electronic components (14) on the circuit board to be shielded, wherein the device is arranged such that a metal portion of an exterior wall (120) of the housing electromagnetically seals off the shield member at its other second end (134).

11 Claims, 2 Drawing Sheets

ELECTRONIC DEVICE HAVING A SHIELD MEMBER AND A SHIELD GASKET

BACKGROUND OF THE INVENTION

The present invention is concerned with electromagnetic shielding in electronic devices, especially radio devices. The present invention has particular applicability to radiotelephone transceivers manufactured in the format of a PC card or PCMCIA card.

Electromagnetic signals are generated as a by-product during normal operation of an electrical circuit. Electromagnetic compatibility (EMC) is defined as the ability of a device to function properly in its intended electromagnetic environment and not be a source of unacceptable pollution to that environment. In some situations, shielding is required to provide electromagnetic compatibility between a sensitive or noisy part of the circuit and the rest of the circuit. One typical example is the isolation of a frequency synthesiser from the rest of the RF section in a cellular radiotelephone.

FIG. 1 shows a conventional approach to providing electromagnetic shielding in this situation.

Referring to FIG. 1, a radiotelephone housing 10 has located within it a printed circuit board 12. The printed circuit board 12 carries surface mount components. Some of these components 14, for example the frequency synthesiser, require shielding from other components 16, for example the rest of the RF section 16. To this end, a shield box 18 is used to enclose electromagnetically the components 14 and thus provide for EMC between the components 14 and the component 16.

However, because of the mechanical tolerances required in the height of the shield box 18, resulting from the manufacturing of the shield box 18 itself or the surface mount process, a gap must be designed for between the roof 18a of the shield box and the housing 10. This space plus the thickness of the roof 18a of the shield box 18 equates to the cost in terms of height which this conventional approach to shielding incurs. The 'height cost' is illustrated in FIG. 1 by double headed arrow h1.

The present invention is concerned with reducing the height cost which this conventional approach inevitably incurs.

BRIEF SUMMARY OF THE INVENTION

With this in mind, the present invention provides, in one aspect, a portable device comprising a housing; a circuit board located within the housing; and a shield member mounted at a first end on the circuit board so as to surround electronic components on the circuit board to be shielded, wherein the device is arranged such that a conductive portion of an exterior wall of the housing electromagnetically seals off the shield member at the other second end.

By virtue of these features, the need for a roof 18a to the shield box 18 in FIG. 1 is eliminated. Consequently, the thickness of the roof 18a no longer counts towards the height cost of the shielding and the aforementioned design tolerances associated with it are thus reduced.

The height cost of the shielding associated with the present invention is less than that associated with the conventional approach in FIG. 1. This means that either components having a higher maximum height can be used or the overall volume of the device reduced if components with the same maximum height are used.

In addition, the tubular shield member of the present invention is even simpler to manufacture than the shield box 18.

Preferably, a gasket is located at the second end of the shield member to facilitate electromagnetic sealing. Alternatively, a conductive adhesive can be used to adhere the gasket to the shield member and thus provide ohmic contact therebetween.

Both of these embodiments of the invention enjoy the advantage that no special structural modification to the housing wall is required to implement them.

In other embodiments, a gasket can be used to mount the first end of the shield to the printed circuit board.

It will be appreciated that the height savings which are available when employing the present invention are particularly useful in connection with a PC card based product, such as the PCMCIA card based cellular transceiver which is described hereinafter, which is extremely constrained height/thickness -wise.

BRIEF DESCRIPTION OF THE DRAWINGS

Exemplary embodiments of the invention are hereinafter described with reference to the accompanying drawings, in which.

DETAILED DESCRIPTION OF THE INVENTION

Figure 2:
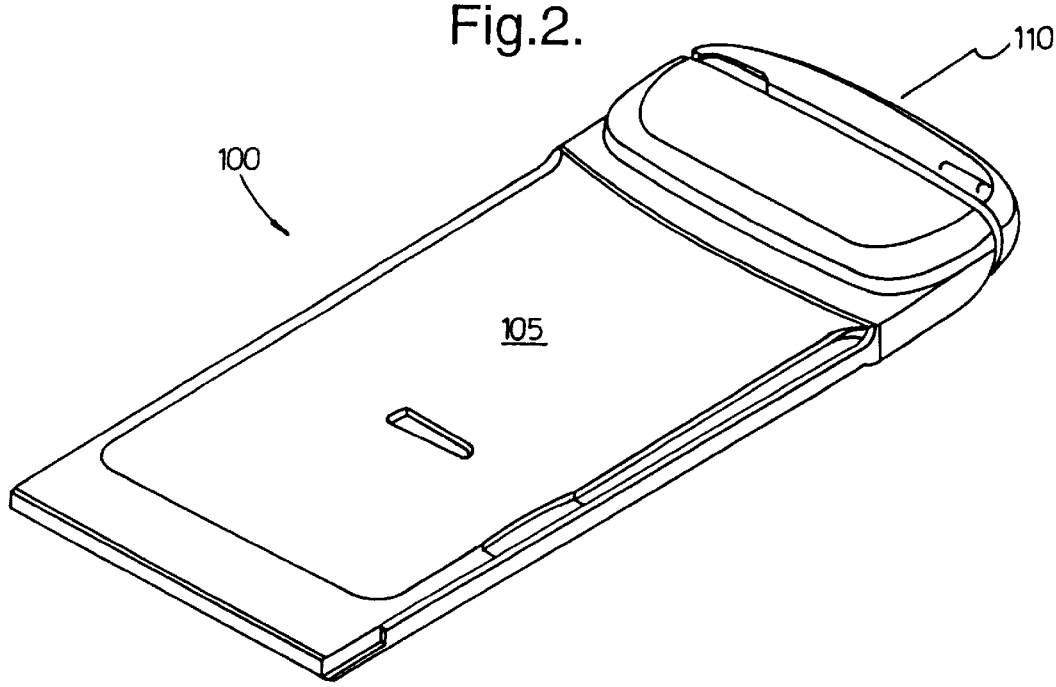
FIG. 2 shows a perspective view of a cellular radiotelephone transceiver in the format of a PC card.

FIG. 2 shows a cellular radiotelephone transceiver embodied in the form of a PC card or PCMCIA card 100. It is designed to be inserted in the standard PCMCIA connector of a laptop or high-performance palmtop computer and provide an integrated solution to wireless communication including speech, data and fax services, and Short Message Services (SMS) over digital cellular networks.

Mechanically, the card 100 has a housing consisting of a main portion 105 which is received within the PCMCIA connector of a host computer and an extended portion 110 by which the card 100 is handled by a user when inserting and withdrawing the card 100. The extended portion 110 is thicker than the main portion 105 and is used to house the larger surface mount components. Clearly, within the main portion 105 of the card 100 the overall thickness or height of the card is tightly constrained by the requirement that the card 100 be insertable within a standard PCMCIA connector. Height considerations within the main portion 105 are thus of paramount importance.

Figure 1:
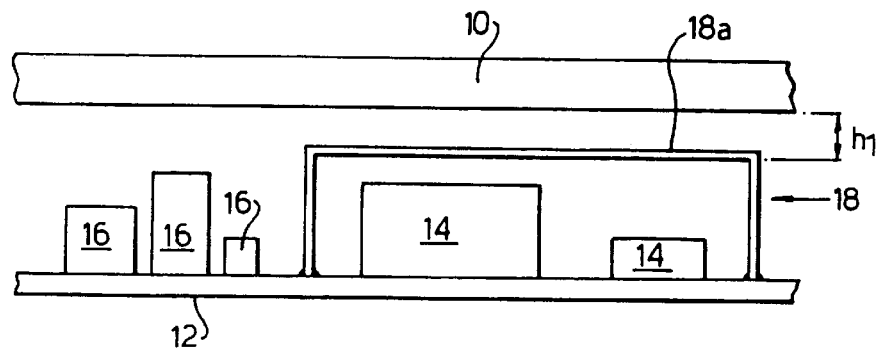
FIG. 1 shows a conventional approach to provide electromagnetic shielding.
Figure 3:
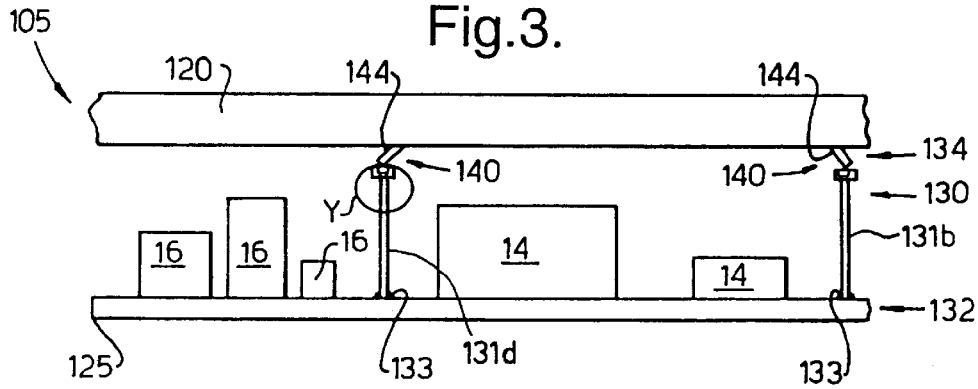
FIG. 3 shows a cross-sectional view of the PC card illustrating the present invention.

FIG. 3 shows a partial cross-sectional view of the main portion 105 of the card 100. The walls 120 of the housing of the main portion 105 are made from metal. Within the housing, a printed circuit board 125 carrying surface mount components is located. Obviously, it is these components which provide the functionality of the card 100. However, the details of these components do not form part of the present invention, except to say (as in FIG. 1) that some components 14, providing, for example, the frequency synthesiser, require shielding from other components 16, say, for example, the rest of the RF section. To this end, a tubular shield member 130 is surface mounted at one end, hereinafter its first end 132, to the printed circuit board 125 so as to surround the components 14. The tubular shield member 130 is of rectangular cross-section and is defined by side walls designated 131a, 131b, 131c, 131d (only side walls 131b, 131d are visible in FIG. 3). In other embodiments, the tubular shield member 130 need not be rectangular in cross-section. The solder connection 133 at the first end of the shield member 130 provides an ohmic connection to the printed circuit board 125 and so prevents leakage of electromagnetic radiation between the printed circuit board 125 and the shield member 130 at its first end 132.

Figure 4A:
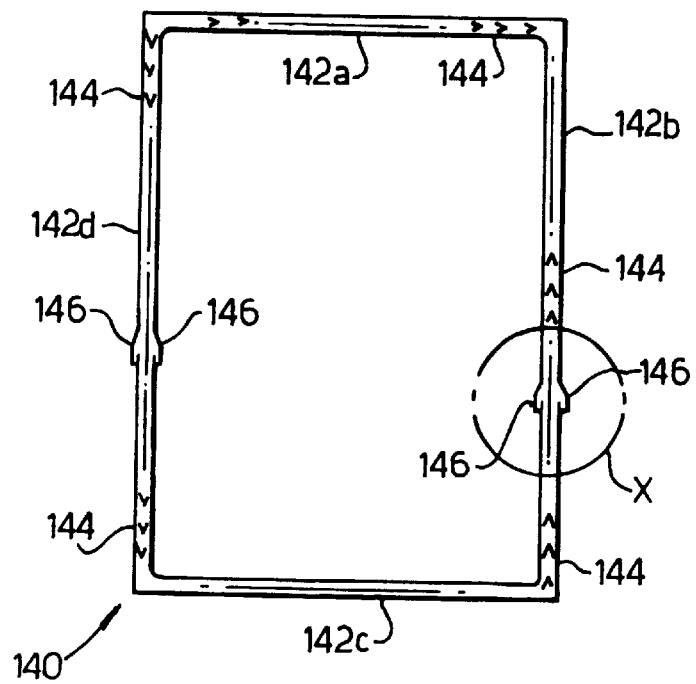
FIG. 4(a) shows in isolation and in more detail the gasket in FIG. 3.
Figure 4B:
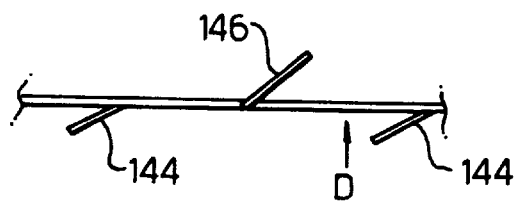
FIG. 4(b) shows the area in a circle marked X in FIG. 4(a) in cross-section along the central longitudinal axis of the limb.

At the second end 134 of the tubular shield member 130, a gasket 140 is fitted. The gasket is shown in more detail in FIGS. 4(a), 4(b), 4(c). Referring to FIG. 4(a), the gasket 140 comprises a planar network or framework of interconnected planar limbs 142a, 142b, 143b, 143d corresponding to a wall 131a, 131b, 131c, 131d of the tubular shield member 130. Each limb 142 is provided with a plurality of tangs 144 upstanding centrally from the plane of the limbs 142 along the whole of their length. As illustrated in FIG. 4(a) some tangs have been omitted and replaced with a line to aid the overall clarity of the drawing. Each tang 144 is depressible, as illustrated by arrow D, towards the plane of its associated limb 142 such that the tangs 144 can adopt a range of angles relative thereto, for example from its natural bias position shown in FIG. 4(b) to a position in which it is co-planar with its associated limb. The limbs 142b and 142d are also provided with a pair of projections 146 equipped with barbs 148 which upstand in the opposite direction to the tangs 144.

Returning to FIG. 3, the function of the tangs 144 is to provide adequate electromagnetic sealing between the gasket 140 and the shield member 130. The range of angles which each tang 144 can adopt compensates for dimensional tolerances between the shield member 130 and the wall 120 to prevent unacceptable electromagnetic leakage therebetween. In connection with FIG. 3, it is pointed out that the tangs 144 are depicted as converging towards each other in order to make clearly distinguishable the tangs 144 in the FIG. 3 view. In fact, as can be seen from FIG. 4(a), each tang 144 extends axially along the length of its associated limb. Also, the tangs 144 are shown at an angle which seems to approach that of its natural-bias position in FIG. 4(b) i.e. in slightly exploded form. This is again to more clearly illustrate the operation of the gasket 140. In practice, each tang 144 would to slightly varying degrees of approximation be co-planar with its associated limb subject to the tolerance considerations discussed above.

Figure 4C:
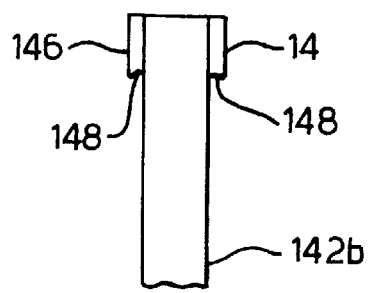
FIG. 4(c) shows in area in a circle market Y in FIG. 3 in enlarged form.

The function of the pairs of projections 146 on the limbs 142b and 142d is to bite into the side walls 131b and 131d respectively, and thereby secure the gasket 140 to the shield member 130. The biting action of the barbs 148 on the projections 146 associated with the limb 142b is shown in FIG. 4(c).

The gasket 140 may be separate from or integral with the shield member 130.

What is claimed is:

1. A portable device comprising a housing; a circuit board comprising a substrate and electronic components mounted on the substrate, the substrate and electronic components being located within the housing; a shield member having a first end mounted on the circuit board so as to surround electronic components on the circuit board to be shielded; and a gasket located at a second end of the shield member to facilitate electromagnetic sealing, wherein the device is arranged such that a conductive portion of an exterior wall of the housing electromagnetically seals off the shield member at the second end, and wherein the housing surrounds the substrate of the circuit board.

2. A portable device comprising a housing; a circuit board located within the housing; and a shield member having a first end mounted on the circuit board so as to surround electronic components on the circuit board to be shielded, wherein the device is arranged such that a conductive portion of an exterior wall of the housing contacts an end edge of the shield member at a second end of the shield member and electromagnetically seals off an opening into the shield member at the second end of the shield member, and wherein the exterior wall is made from plastics material and the conductive portion comprises a metal coated region applied to the wall.

3. A portable device comprising a circuit board having a substrate and a plurality of electronic components mounted upon at least one surface of the substrate, some of which electronic components require electromagnetic shielding and some of which do not require electromagnetic shielding, a housing surrounding the substrate of the circuit board, the housing having a conductive portion, and a shield member having a first end mounted on the circuit board so as to surround those electronic components on the circuit board to be shielded and a second end defining an opening into the shield member, wherein the device is arranged such that the conductive portion of the housing electromagnetically seals off the opening into the shield member at the second end of the shield member.

4. A portable device comprising a housing having a conductive portion; a circuit board located within the housing; and a shield member, the circuit board comprising first and second electronic components located within the housing and mounted to at least one surface of the circuit board, wherein the shield member has a first end mounted on the circuit board to be shielded and the shield member does not surround the second electronic component, wherein the device is arranged such that a second end of the shield member is mounted edge on to the conductive portion of the housing to electromagnetically seal off an opening into the shield member at the second end of the shield member.

5. A portable device comprising a housing having a conductive portion; a circuit board located within the housing; and a shield member, the circuit board comprising first and second electronic components located within the housing and mounted to at least one surface of the circuit board, wherein the shield member is positioned to separate the first and second electronic components and has a first end mounted on the circuit board and a second end mounted edge on to the conductive portion of the housing to provide electromagnetic sealing of the electronic components from one another.

6. A portable device comprising a housing; a circuit board located within the housing; and a shield member mounted at a first end on the circuit board so as to surround electronic components on the circuit board to be shielded, wherein the device is arranged such that a conductive portion of an exterior wall of the housing electromagnetically seals off the shield member at a second end, further comprising a gasket located at the second end of the shield member to facilitate electromagnetic sealing, the gasket comprising a planar framework of limbs; means for securing the gasket to the shield member and a plurality of spring tabs which bear against the metal portion of the exterior wall.

7. A device as in claim 6, wherein conductive adhesive located at the second end of shield member provides electromagnetic sealing.

8. A device as in claim 6, wherein the device is a PCMCIA card based cellular transceiver.

9. A device as in claim 6 wherein the conductive portion comprises an exterior wall of the housing.

10. A device as in claim 9 wherein said exterior wall is made from metal.

11. A device as in claim 9 wherein said exterior wall is made from plastics material and the conductive portion comprises a metal coated region applied thereto.

* * * * *